United States Patent [19]

Olivo et al.

[11] Patent Number: 4,922,402
[45] Date of Patent: May 1, 1990

[54] CMOS VOLTAGE MULTIPLIER

[75] Inventors: Marco Olivo, Bergamo; Luigi Pascucci, Sesto S. Giovanni; Corrado Villa, Sovico, all of Italy

[73] Assignee: SGS-Thomson Microelectronics S.r.l., Italy

[21] Appl. No.: 372,493

[22] Filed: Jun. 28, 1989

[30] Foreign Application Priority Data

Jun. 28, 1988 [IT] Italy ............................... 83645 A/88

[51] Int. Cl.⁵ ............................................. H02M 7/19
[52] U.S. Cl. ..................................... 363/60; 307/246; 307/110
[58] Field of Search ...................... 363/59, 60, 61, 126; 307/109, 110, 246; 320/1

[56] References Cited

U.S. PATENT DOCUMENTS

| | | | |
|---|---|---|---|
| 3,790,812 | 2/1974 | Fry | 307/110 |
| 4,061,929 | 12/1977 | Asano | 363/60 |
| 4,344,003 | 8/1982 | Harmon et al. | 307/246 |
| 4,398,099 | 8/1983 | Benoit-Gonin et al. | 363/60 |
| 4,621,315 | 11/1986 | Vaughn et al. | 363/60 |
| 4,839,787 | 6/1989 | Kojima et al. | 363/60 |

*Primary Examiner*—Peter S. Wong
*Attorney, Agent, or Firm*—Pollock, Vande Sande & Priddy

[57] ABSTRACT

A wholly integrated, multistage, CMOS voltage multiplier utilizes as a diode structure for transferring electric charge from an input node to an output node of each stage an enhancement type MOS transistor, the gate of which is coupled to the same switching phase to which the output capacitor of the stage is connected by means of a coupling capacitor. During a semicycle of charge transfer through said MOS transistor, the coupling capacitor charges through a second MOS transistor of the same type and having the same threshold of said charge transfer MOS transistor, connected in a diode configuration between the output node of the stage and the gate of the charge transfer MOS transistor, in order to cut-off the latter when reaching a voltage lower than the voltage reached by the output node by a value equal to the threshold value of said second transistor. In this way, a significant voltage drop across the charge transfer transistor is efficiently eliminated, thus allowing the generation of a sufficiently high output voltage though having available a relatively low supply voltage.

3 Claims, 1 Drawing Sheet

CMOS VOLTAGE MULTIPLIER

BACKGROUND OF THE INVENTION

1. Field of the Invention

The present invention relates to a fully integrated, CMOS voltage multiplier particularly useful for EPROM and EEPROM memory devices.

2. Description of the Prior Art

In consideration of the fact that wholly integrated voltage multipliers are capable of generating a relatively high voltage, obtained by multiplying a relatively low supply voltage, suiting the level required when writing and erasing CMOS-EEPROM memories through the Fowler-Nordheim tunnelling mechanism, the practice of integrating voltage multipliers in such memory devices for this purpose has become very common. In other integrated circuits it may also be useful to integrate a voltage multiplier as for example in EPROM memories for the purpose of rising the gate voltage of the input transistor of the high voltage supply of the circuitry in order not to subtract such a high voltage from the transistor's threshold.

The voltage multiplier is a well known circuit and a diagram thereof is depicted in FIG. 1. Phi 1 and phi 2 are two square-wave signals, substantially in phase opposition between themselves, generated by a suitable oscillator. By supposing ideal the diodes and the square-wave signals to have an amplitude equal to the supply voltage Vcc, the asymptotic level approached by the output voltage Vout, in an open circuit situation, is equal to n times Vcc, wherein n is the number of stages of the multiplier circuit. In a starting condition with all the capacitors discharged and phi 1=Vcc and phi 2=0, the C1 capacitor charges to the Vcc voltage, while the capacitor C2 is still uncharged. When phi 1 and phi 2 switch, because the diode cannot sustain a positive voltage across its terminals, the capacitor C1 pours charge in the capacitor C2, which thus charges to the voltage Vcc; a similar transfer of electrical charge will occur from all odd numbered capacitors to the even numbered capacitors in the diagram of FIG. 1. When phi 1 and phi 2 switch again, the capacitor C1 recharges through the supply and no return of charge from C2 occurs because the diode D1 is reverse biased; similarly all the other odd numbered capacitors recharge by means of the current provided by the preceding stage (to the left thereof in the diagram). Under open circuit conditions, i.e., when no current is drawn from the output terminal of the last stage, the Vout will be decisively greater than Vcc because of the transfer of electrical charge from the preceding stage; moreover, the current drawn from the preceding stage upon any subsequent switching will become progressively smaller because the output capacitor will result already partially charged. At steady state, any intermediate node of the voltage multiplier assumes a voltage greater than the preceding intermediate node by a quantity equal to the supply voltage, and therefore the output voltage Vout is equal to n times the supply voltage Vcc. The theoretical value of n·Vcc represents an upper limit which cannot be reached in practice. Deviations from such an ideal condition being due to the following reasons:

(a) a diode has a threshold voltage Vt>0 and therefore not all the electrical charge C·Vcc may be transferred to the following stages as in an ideal situation, and therefore any diode is in practice biased at a voltage equal to Vcc−Vt. Moreover a diode has an intrinsic ON resistance which causes a further voltage drop thereacross during the conduction phase of the diode;

(b) the switching signals phi 1 and phi 2 are not ideal square-waves and do not ensure a Vcc voltage for the entire cycle of electrical charge transfer from a stage to a following stage;

(c) the circuit components of an integrated voltage multiplier have parasitic capacitances toward the substrate and the effect of these capacitances is that of limiting the charge transfer to the multiplier because a portion of the electrical charge flows directly to the substrate;

(d) the current drawn from the output terminal of the multiplier is not negligeable and therefore the output Ro resistance of the multiplier circuit affects the ultimate output voltage which may be practically reached. Said output resistance Ro may be easily calculated through a simplified analysis of the multiplier circuit. The (maximum) amount of charge transferred in a cycle equals to: C·Vcc, so that, being T the period of the oscillator which generates the two phases phi 1 and phi 2, it is $$Iout = \frac{C \cdot Vcc}{T}$$

and $$Ro = \frac{Vout}{Iout} = \frac{n \cdot Vcc}{Cf \cdot Vcc}$$

where $f=1/T$ is the frequency of the oscillator, Therefore the output resistance is given by:

$$Ro = \frac{n}{Cf}$$

In order to decrease Ro it is therefore necessary to increase C and the frequency of the oscillator. A practical upper limit for this frequency is in the order of about 10 MHz. Typical capacitance values which may be integrated without an excessive area requirement are of about few pF. It follows that a typical value of Ro is of about 100K ohm per stage. This non-negligeable output resistance vanifies efforts to increase the output voltage by increasing the number of stages beyond a certain limit because the concomitant increase of the total output resistance Ro reduces the current which may be delivered to the high voltage rail. In the publication "IEEE Transaction of Electron Devices" VOL.ED-27, NO. 7, July 1980, Pages 1211–1216, a 1.5 V supply voltage embodiment of an integrated multiplier utilizing bipolar diodes obtained by flanking a p-doped polysilicon to an n-doped polysilicon is described. Such a solution obviously requires additional masks, and furthermore the threshold of those diodes has a large spread. The most commonly used form of this circuit, both in NMOS and in CMOS technology, contemplates the use of n-channel MOS transistors with gate and drain connection in common in place of bipolar diodes, as shown in FIG. 2. If the ratio W/L (Width/Length) of each transistor is sufficiently large in respect to the current flowing therethrough, the Vgs voltage will always be slightly higher than the threshold and the behaviour of the transistor will approximate that of a diode having a threshold similar to the threshold of a MOS transistor. It is not convenient to excessively increase the width (W) of the transistor in order to avoid that the parasitic capacitances toward the substrate (which are approximatively proportional to W·L) become comparable to the capacitances of the multiplier circuit.

There is however a substantial difference between a diode made by means of a MOS transistor and a true bipolar diode. The latter has a threshold voltage of about 0.6 V, which would be constant for all the stages of the multiplier circuit, while the threshold voltage of a MOS transistor increases because of the "body" effect whenever the source voltage Vs departs from the value of the body voltage Vb in accordance with the known law:

$$Vt = Vto + \gamma (\sqrt{|Vsb - 2\Phi F|} - \sqrt{|2\Phi f|})$$

where Vto is the threshold voltage when the voltage difference between source and body (Vsb) is equal to zero and where ΦF is the electrostatic potential of the p-type substrate at equilibrium and γ is an empirically evaluated constant depending on the specific fabrication process used. For typical values of γ (0.47) and of Vto (900 mV) for n-channel transistors, the transistor threshold in the last stages of the multiplier circuit, wherein the source voltage rises beyond 15 V, is higher than 2.3 V. Even by utilizing nonimplanted transistors having, for example, a 600 mV lower threshold voltage and a γ slightly reduced, the threshold remains higher than 1.5 V, i.e. much higher than that of bipolar diodes. This disadvantage, which may be acceptable with a 5 V supply, becomes highly penalizing when the supply (and therefore the amplitude of the square-wave signals fed to the circuit) drops below 3 V, so that more than 50% of this voltage is lost across the MOS diodes and the voltage multiplier's efficiency drops dramatically. In this case the voltage increment from one stage to the following is very small and the number of stages required to reach e.g. 18-20 V would result in an extremely high Ro. A susbtantial improvement could be achieved by utilizing a depletion-type transistor for the last stages with a negative threshold such as to nullify the body effect. The average threshold of the MOS diodes would then approach that of bipolar diodes. For fabricating a depletion transistor additional masks and process steps are needed, with an attendant increase of the fabrication costs and therefore alternative means for obviating to the problem are sought.

SUMMARY OF THE INVENTION

In contrast to the prior art circuits, the entirely integrated, CMOS voltage multiplier object of the present invention permits the charge transfer from a stage to a successive stage of the multiplier circuit through a diode equivalent structure, the threshold of which is substantially nil, and therefore favors such a charge transfer also with a relatively low supply voltage, besides naturally favoring the achievement of a high output voltage with a lesser number of stages.

DESCRIPTION OF THE PREFERRED EMBODIMENT

Basically the voltage multiplier circuit of the invention utilizes a diode equivalent structure, the threshold voltage of which is determined by the difference between the threshold voltages of two MOS transistors. Such a difference, which may be defined by analogy what discussed above as an equivalent Vt, is nil for similar transistors, and therefore favors charge transfer under a relatively low supply voltage.

Figure 1:
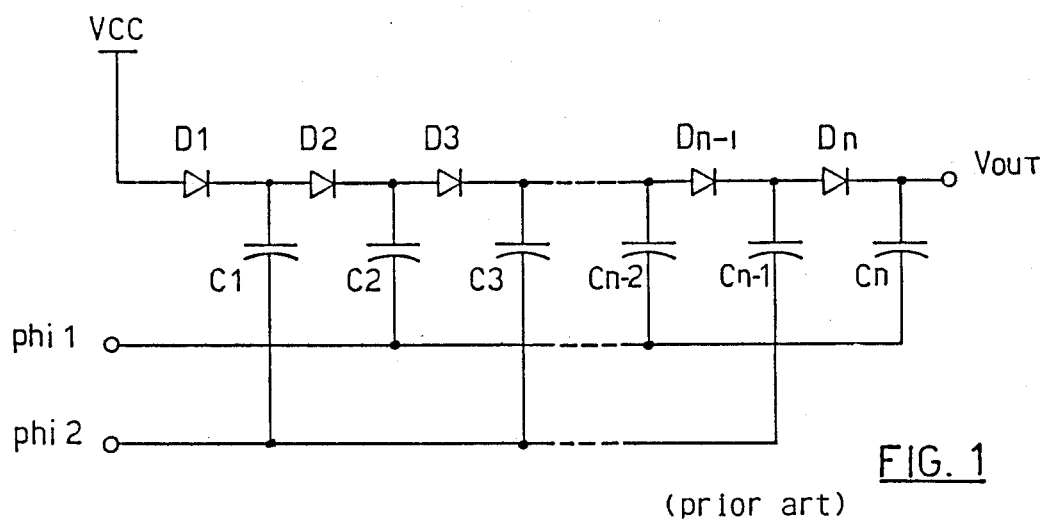
FIG. 1 depicts a basic diagram of a voltage multiplier circuit.
Figure 2:
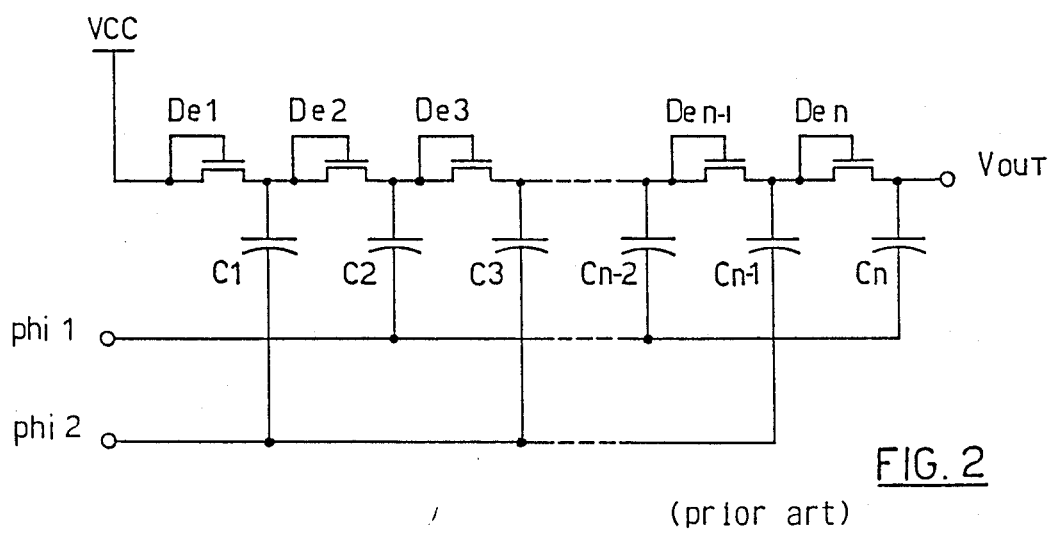
FIG. 2 depicts the circuit diagram of a voltage multiplier employing diode-connected MOS transistors according to prior art.
Figure 3:
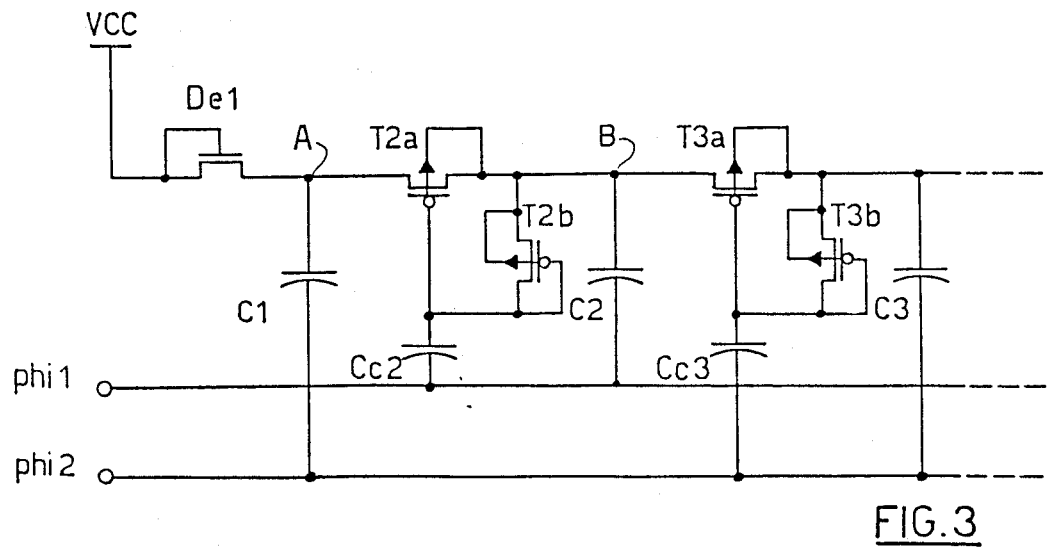
FIGS. 3 depicts a circuit diagram of a CMOS voltage multiplier made in accordance with the present invention. The circuits shown in the figures relates to the case of a voltage multiplier for a positive voltage and, for an easy comparison, the succession of identification numbers of the repeatitive stages of the circuit has been maintained uniform as far as possible in all the figures. Obviously, in case of voltage multipliers for negative voltages, all polarities will be inverted.

With reference to FIG. 3, such a diode equivalent structure is substantially represented by an enhancement type CMOS transistor, which in the embodiment shown is a p-channel transistor (T2a, T3a, ...), having a source and a drain functionally connected respectively to a first intermediate node and to a successive second intermediate node (i.e. to the input and output of any one stage of the multiplier circuit) or to the output terminal Vout of the multiplier circuit, not shown in FIG. 3). The gate of this p-channel transistor is coupled by means of a coupling capacitor (Cc2, Cc3, ...) to the rail of the square-wave switching signal (phi 1 or phi 2) to which the respective output capacitor of the particular stage of the multiplier (C2, C3, ...) is connected. A second CMOS transistor (T2b, T3b, ...) of the same type of the charge transfer transistor (T2a, T3a, ...) and having essentially the same threshold voltage of the latter is connected in a diode configuration between the drain and the gate of the charge transfer transistor.

The operation of each multiplying stage of the voltage multiplier circuit of the invention may be described as follows, making reference to one of said stages formed by the charge transfer transistor T2a and by the respective output capacitor C2 and comprised between the two intermediate nodes A and B of the circuit of FIG. 3.

The phase opposition square-wave switching signals phi 1 and phi 2 are not only applied across the capacitors used for transferring the electrical charge: C1, C2, C3, ..., etc., but also to the gate of the transistor T2a through the relative coupling capacitor Cc2. By assuming the capacitors C2, C3, ..., etc., relatively uncharged and phi 1=0 and phi 2=Vcc, the transistor T2a is conducting and the capacitor C2 may charge therethrough. Simultaneously to the charging of C2, also the charging of the capacitor Cc2 takes place through the transistor T2b, but the voltage which the capacitor Cc2 (and therefore the gate of the charge transfer transistor T2a) may reach is lower by a value equal to the threshold voltage of the transistor T2b in comparison to the supply voltage Vcc. In other words, if the A node is at 5 V (Vcc), the following node B is free to rise in potential until the voltage across the coupling capacitor Cc2 is such as to cut-off the charge transfer transistor T2a. Because the threshold of the transistor T2b is equal to the threshold of the transistor T2a, the voltage drop across the latter is practically nil. When the two signals phi 1 and phi 2 switch, the transistor T2a must be in a cut-off condition in order to prevent an undue back flow of electrical charge. This is ensured by the fact that the B node voltage and therefore the gate voltage of the transistor T2a rises because the phi 1 signal assumes a high level, commonly equal to the supply voltage Vcc, and consequently the transistor T2a which was OFF at the end of the preceding semicycle, remains in such a condition until the next switching of the two phases phi 1 and phi 2. Simultaneously, in a totally similar manner, the transistor T3a will start conducting and the capacitor C2 will pour charge into the following stage (C3), through a repetition of events described above.

Naturally, the voltage multiplier circuit may also employ initial stages of a conventional type with the utility of stages made in accordance with the present invention particularly in the final output stages of the circuit. It is therefore possible to make one or more initial stages of the multiplier circuit in accordance with the prior art. In this respect, it may be observed in FIG. 3 that the first "diode" De1 is made by utilizing a diode-connected NMOS transistor, as in a prior art circuit.

The objective of providing a CMOS voltage multiplier capable of transferring charge with a low voltage drop across the charge transfer "diodes" and therefore suitable to operate with a relatively low supply voltage is fully met without recurring to complex modifications of the fabrication process which would be required by employing depletion type transistors.

The various capacitances and the dimensions of the transistors may be conveniently optimized in order to achieve the highest output voltage Vout while keeping into account the following aspect which is relative to the embodiment depicted in FIG. 3.

The n-well regions, wherein the p-channel transistors of the integrated voltage multiplier of the invention depicted in FIG. 3 are formed, are electrically short-circuited to the diffusion which normally is at a relatively high potential: in the case of the transistor T2a to the B node, i.e. to the drain diffusion. When the switching signals phi 1 and phi 2 switch so that the transistor T2a becomes conductive, it is the other diffusion, i.e. the source diffusion, which assumes the highest potential, i.e. the A node. Therefore the ratio W/L of the transistor T2a must be established in respect of the characteristics of the final stage of the oscillator which generates the switching signals phi 1 and phi 2 in such a way that said source diffusion is prevented to reach a potential greater than the well potential by 300–400 mV, in order to prevent a direct biasing of the relative junction and the triggering of latch-up phenomena.

What we claim is:

1. A wholly integrated, multistage, CMOS voltage multiplier comprising a plurality of diodes or equivalent integrated structures functionally connected in series between a supply terminal and an output terminal through which a current may be delivered at a voltage having an absolute value higher than the absolute value of a supply voltage applied to said supply terminal and at least a stage output capacitor connected between each intermediate node between any two diodes of said series of diodes and between said output terminal and alternately a first and a second rail to which are respectively applied two square-wave switching signals, in phase opposition to each other and having a high absolute value which is substantially equal to the absolute value of said supply voltage and a substantially nil low absolute value, wherein at least one of said diode equivalent integrated structures comprises a first enhancement-type CMOS transistor of a first type of polarity, having a source and a drain functionally connected respectively to a first intermediate node and to a successive second intermediate node of said series or to said output terminal, a body electrically short-circuited to said drain and a gate which is coupled through a coupling capacitor to the one of said first and second rails to which said stage output capacitor, connected to said successive second intermediate node of the series or to said output terminal is connected;

a second enhancement-type CMOS transistor, having the same polarity and a threshold voltage identical to said first enhancement-type CMOS transistor and having a drain and a body connected in common to said successive second intermediate node of the series and a gate and a source connected in common to the gate of said first CMOS transistor;

said coupling capacitor charging through said second transistor, for determining the cut-off of said first transistor during a conducting phase of the latter, at a maximum voltage having an absolute value lower than the absolute value of the voltage of said successive intermediate node by a quantity equal to the absolute value of the threshold voltage of said second transistor, and allowing electric charge transfer from said first intermediate node to said successive second intermediate node or to said output terminal through said first transistor under a null threshold condition.

2. The CMOS voltage multiplier of claim 1, wherein said supply voltage is a positive voltage and said CMOS transistors are p-channel transistors.

3. The CMOS voltage multiplier of claim 1, wherein said supply voltage is a negative voltage and said CMOS transistors are n-channel transistors.

* * * * *